United States Patent
Krishnamurthy et al.

(10) Patent No.: US 11,985,445 B2
(45) Date of Patent: May 14, 2024

(54) MEMORY CARD PERFORMANCE CHARACTERISTIC DETECTION AND MONITORING

(71) Applicant: GoPro, Inc., San Mateo, CA (US)

(72) Inventors: Naveen Chinya Krishnamurthy, Fremont, CA (US); Ojas Gandhi, San Ramon, CA (US); Michael A. Ramirez, Mountain View, CA (US)

(73) Assignee: GoPro, Inc., San Mateo, CA (US)

( * ) Notice: Subject to any disclaimer, the term of this patent is extended or adjusted under 35 U.S.C. 154(b) by 165 days.

(21) Appl. No.: 17/678,414

(22) Filed: Feb. 23, 2022

(65) Prior Publication Data

US 2023/0053532 A1 Feb. 23, 2023

Related U.S. Application Data

(60) Provisional application No. 63/234,145, filed on Aug. 17, 2021.

(51) Int. Cl.
| | |
|---|---|
| *H04N 5/907* | (2006.01) |
| *G11C 29/08* | (2006.01) |
| *H04N 5/77* | (2006.01) |
| *H04N 5/91* | (2006.01) |

(52) U.S. Cl.
CPC ............ *H04N 5/907* (2013.01); *G11C 29/08* (2013.01); *H04N 5/772* (2013.01); *H04N 5/91* (2013.01)

(58) Field of Classification Search
CPC ...... H04N 1/21; H04N 1/2137; H04N 1/2141; H04N 5/772; H04N 5/76; H04N 5/765; H04N 5/77; H04N 5/91; H04N 5/907; G11C 29/022; G11C 29/08; G11C 29/02; G11C 2029/0409
See application file for complete search history.

(56) References Cited

U.S. PATENT DOCUMENTS

| | | | |
|---|---|---|---|
| 7,015,959 B1 * | 3/2006 | Morita | H04N 1/2137 348/222.1 |
| 2006/0055808 A1 * | 3/2006 | Maeng | H04N 5/772 386/E5.072 |
| 2006/0285129 A1 * | 12/2006 | Yamaguchi | H04N 1/00299 358/302 |
| 2019/0124255 A1 * | 4/2019 | Ueguri | H04N 5/77 |
| 2019/0132472 A1 * | 5/2019 | Ogata | H04N 1/2141 |

* cited by examiner

*Primary Examiner* — Kelly L Jerabek
(74) *Attorney, Agent, or Firm* — Young Basile Hanlon & MacFarlane, P.C.

(57) ABSTRACT

Methods and systems for detecting and monitoring memory card performance characteristics. A method for detecting memory card performance characteristics includes obtaining at least one memory card performance characteristic from a memory card when the memory card is inserted in an image capture device, determining whether the at least one memory card performance characteristic meets a defined image capture device requirement, and providing an alert when the at least one memory card performance characteristic fails to match the defined image capture device requirement.

20 Claims, 12 Drawing Sheets

MEMORY CARD PERFORMANCE CHARACTERISTIC DETECTION AND MONITORING

CROSS REFERENCE TO RELATED APPLICATION

This application claims priority to U.S. Provisional Application Ser. No. 63/234,145 filed Aug. 17, 2021, which is incorporated herein by reference.

TECHNICAL FIELD

This disclosure relates to memory cards and in particular, detection and monitoring of memory card operating characteristics.

BACKGROUND

Image capture devices use memory cards to store content such as images, video, and audio. Memory cards, such as but not limited to, secure digital (SD) cards, are provided by vendors with written or stated performance characteristics, such as but not limited to, access speed mode, transfer speed mode, speed grade, speed class, or combinations thereof. Not all memory cards are supported by the image capture devices. When a user uses a low performance memory card that is not supported by the image capture device, memory card errors can happen during content processing and the content processing session or image capture device can stop or freeze abruptly. This can lead to loss of content and unhappy users. Moreover, the stated performance characteristics can change after memory card usage. Again, this can lead to the content processing session or image capture device stopping or freezing abruptly.

SUMMARY

Disclosed herein are implementations of methods and systems for detecting and monitoring memory card performance or operating characteristics.

In implementations, a method for detecting memory card performance characteristics includes obtaining at least one memory card performance characteristic from a memory card when the memory card is inserted in an image capture device, determining whether the at least one memory card performance characteristic meets a defined image capture device requirement, and providing an alert when the at least one memory card performance characteristic fails to match the defined image capture device requirement.

In implementations, the at least one memory card performance characteristic is speed class or video speed class. In implementations, the alert is at least one of a visual alert or an audible alert. In implementations, the method further includes processing content detected by the image capture device, writing the processed content to at least one buffer type, checking if a buffer usage level of the at least one buffer type meets a buffer usage threshold, gradually shutting down content processing when the at least one buffer type meets a buffer usage threshold, and providing an alert when the at least one buffer type meets the buffer usage threshold. In implementations, the content is image content. In implementations, the method further includes recording buffer usage levels on the memory card. In implementations, the method further includes retrieving the buffer usage levels from the memory card when the memory card is inserted in the image capture device and providing an alert based on the retrieved buffer usage levels. In implementations, the method further includes monitoring buffer usage levels of different buffers used for accumulating processed content prior to writing to the memory card, comparing the buffer usage levels for the different buffers against a buffer usage threshold, ramping down content processing when a buffer usage level for one of the different buffers meets the buffer usage threshold, and providing an alert when the buffer usage level meets the buffer usage threshold.

In implementations, a method for detecting and monitoring memory card performance characteristics includes obtaining at least one memory card performance characteristic from a memory card when the memory card is inserted in an image capture device, determining whether the at least one memory card performance characteristic meets a defined image capture device requirement, monitoring buffer usage levels of different buffers used for accumulating processed content prior to writing to the memory card, and providing an alert when the at least one memory card performance characteristic fails to match the defined image capture device requirement or when a buffer usage level for one of the different buffers meets a buffer usage threshold.

In implementations, the method further includes processing content detected by the image capture device, writing the processed content to at least one of the different buffers, and comparing the buffer usage levels for the different buffers against the buffer usage threshold. In implementations, the method further includes gradually shutting down content processing when the buffer usage meets the buffer usage threshold. In implementations, the at least one memory card performance characteristic is speed class or video speed class. In implementations, the alert is at least one of a visual alert or an audible alert. In implementations, the content is image content. In implementations, the method further includes storing the buffer usage levels on the memory card. In implementations, the method further includes obtaining the buffer usage levels from the memory card when the memory card is inserted in the image capture device and providing an alert based on the obtained buffer usage levels.

In implementations, an image capture device includes a memory card slot configured to receive a memory card and a processor. The processor configured to retrieve memory card metadata from an inserted memory card, check whether the memory card metadata meets an image capture device processing requirement, and generate an alert when the memory card metadata fails to match the image capture device processing requirement.

In implementations, the image capture device further includes write buffers configured to receive and accumulate processed content detected by the image capture device. The processor is further configured to track buffer usage levels of the write buffers, compare the buffer usage levels for the write buffers against a buffer usage threshold, ramp down content processing when a buffer usage level for one of the write buffers meets the buffer usage threshold, and generate an alert when the buffer usage level meets the buffer usage threshold. In implementations, the processor is further configured to store the buffer usage levels on the memory card. In implementations, the processor is further configured to obtain the buffer usage levels from the memory card when the memory card is inserted in the image capture device and generate an alert based on the obtained buffer usage levels.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1A:
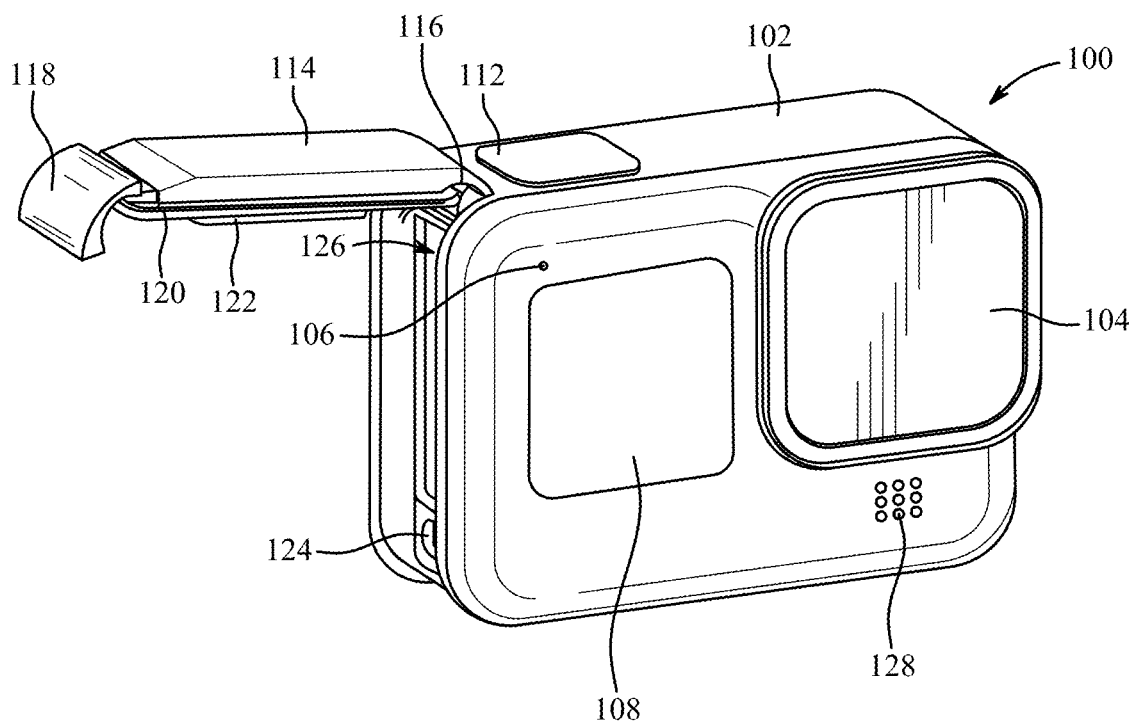
FIGS. 1A-B are isometric views of an example of an image capture device.

Image capture devices use memory cards to store content such as images, video, and audio. These memory cards are provided with written or stated performance characteristics, such as but not limited to, access speed, transfer speed, speed grade, speed class, or combinations thereof. Issues can arise if the stated performance characteristics of the memory card are not sufficient to support the image capture device processing. For example, the stated performance characteristics of the memory card may not represent the real performance characteristics because it is a counterfeit memory card or the stated performance characteristics of the memory card may be degraded due to usage or wear. These low performance memory cards are not able to write fast enough for long periods of time to support capturing of videos or fast time lapses. In these instances, users may see memory card errors while encoding or processing and the image capture device may stop the encoding or processing abruptly.

Implementations of this disclosure provide proactive measures, before content processing and during content processing, which can notify a user and avoid abrupt stopping of a content processing session by gradually stopping the content processing. Implementation of the methods and systems described herein can detect the performance characteristics of the memory card and generate an alert if the detected performance characteristics of the memory card do not meet the requirements of the image capture device. Implementation of the methods and systems described herein can monitor image capture device buffer capacity to determine or infer performance characteristics of the memory card. An alert can be generated if a buffer capacity in the image capture device equals a defined threshold. This can be used to imply that the operating speed of the memory card is unable to meet image capture device requirements.

In implementations, the systems and methods can detect performance characteristics, such as but not limited to, access speed mode, transfer speed mode, speed grade, video speed class, or combinations thereof by obtaining metadata from an inserted memory card. The metadata can be compared against image capture device requirements and an alert can be generated as appropriate.

In implementations, the systems and methods can monitor the usage of a media storage module in image capture device firmware. Usage above a defined threshold infers slow transfer or access speed with respect to the memory card. The content processing can be gradually stopped and an alert or warning can be generated accordingly.

In implementations, the systems and methods can record memory card usage in the memory card. When the memory card is used at a later date, the user can be provided an alert or information based on the recorded memory card usage.

The implementations of this disclosure are described in detail with reference to the drawings, which are provided as examples so as to enable those skilled in the art to practice the technology. The figures and examples are not meant to limit the scope of the present disclosure to a single implementation or embodiment, and other implementations and embodiments are possible by way of interchange of, or combination with, some or all of the described or illustrated elements. Wherever convenient, the same reference numbers will be used throughout the drawings to refer to same or like parts.

Figure 1B:
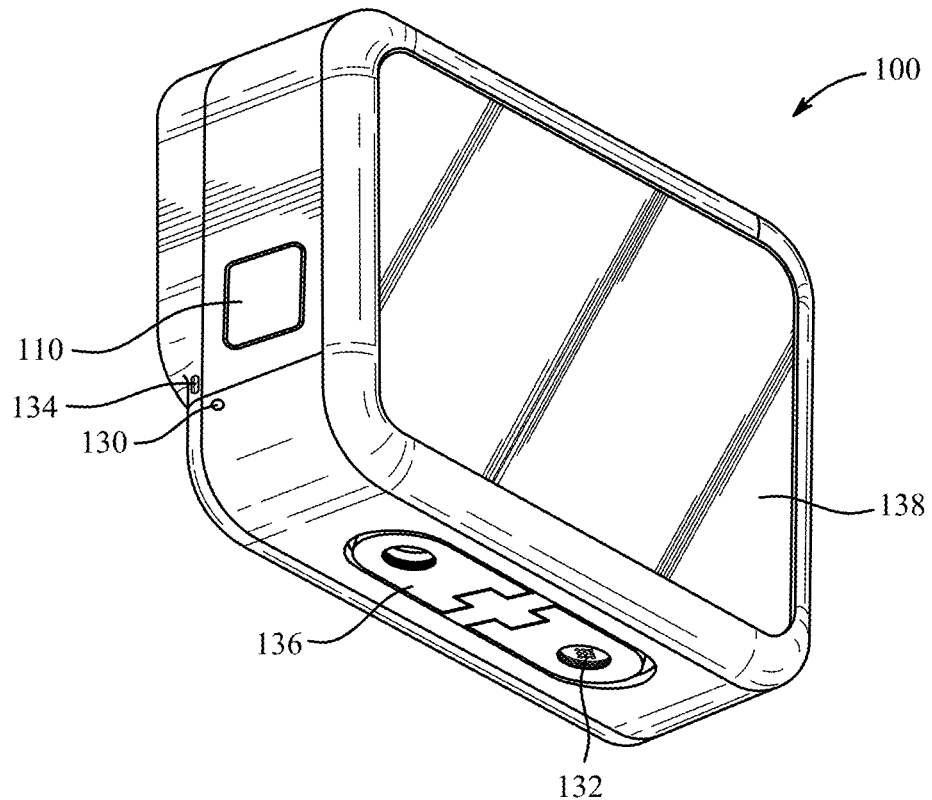

FIGS. 1A-B are isometric views of an example of an image capture device 100. The image capture device 100 may include a body 102, a lens 104 structured on a front surface of the body 102, various indicators on the front surface of the body 102 (such as light-emitting diodes (LEDs), displays, and the like), various input mechanisms (such as buttons, switches, and/or touch-screens), and electronics (such as imaging electronics, power electronics, etc.) internal to the body 102 for capturing images via the lens 104 and/or performing other functions. The lens 104 is configured to receive light incident upon the lens 104 and to direct received light onto an image sensor internal to the body 102. The image capture device 100 may be configured to capture images and video and to store captured images and video for subsequent display or playback.

The image capture device 100 may include an LED or another form of indicator 106 to indicate a status of the image capture device 100 and a liquid-crystal display (LCD) or other form of a display 108 to show status information such as battery life, camera mode, elapsed time, and the like. The image capture device 100 may also include a mode button 110 and a shutter button 112 that are configured to allow a user of the image capture device 100 to interact with the image capture device 100. For example, the mode button 110 and the shutter button 112 may be used to turn the image capture device 100 on and off, scroll through modes and settings, and select modes and change settings. The image capture device 100 may include additional buttons or interfaces (not shown) to support and/or control additional functionality.

The image capture device 100 may include a door 114 coupled to the body 102, for example, using a hinge mechanism 116. The door 114 may be secured to the body 102 using a latch mechanism 118 that releasably engages the body 102 at a position generally opposite the hinge mechanism 116. The door 114 may also include a seal 120 and a battery interface 122. When the door 114 is an open position, access is provided to an input-output (IO) interface 124 for connecting to or communicating with external devices as described below and to a battery receptacle 126 for placement and replacement of a battery (not shown). The battery receptacle 126 includes operative connections (not shown)

for power transfer between the battery and the image capture device 100. When the door 114 is in a closed position, the seal 120 engages a flange (not shown) or other interface to provide an environmental seal, and the battery interface 122 engages the battery to secure the battery in the battery receptacle 126. The door 114 can also have a removed position (not shown) where the entire door 114 is separated from the image capture device 100, that is, where both the hinge mechanism 116 and the latch mechanism 118 are decoupled from the body 102 to allow the door 114 to be removed from the image capture device 100.

The image capture device 100 may include a microphone 128 on a front surface and another microphone 130 on a side surface. The image capture device 100 may include other microphones on other surfaces (not shown). The microphones 128, 130 may be configured to receive and record audio signals in conjunction with recording video or separate from recording of video. The image capture device 100 may include a speaker 132 on a bottom surface of the image capture device 100. The image capture device 100 may include other speakers on other surfaces (not shown). The speaker 132 may be configured to play back recorded audio or emit sounds associated with notifications.

A front surface of the image capture device 100 may include a drainage channel 134. A bottom surface of the image capture device 100 may include an interconnect mechanism 136 for connecting the image capture device 100 to a handle grip or other securing device. In the example shown in FIG. 1B, the interconnect mechanism 136 includes folding protrusions configured to move between a nested or collapsed position as shown and an extended or open position (not shown) that facilitates coupling of the protrusions to mating protrusions of other devices such as handle grips, mounts, clips, or like devices.

The image capture device 100 may include an interactive display 138 that allows for interaction with the image capture device 100 while simultaneously displaying information on a surface of the image capture device 100.

The image capture device 100 of FIGS. 1A-B includes an exterior that encompasses and protects internal electronics. In the present example, the exterior includes six surfaces (i.e. a front face, a left face, a right face, a back face, a top face, and a bottom face) that form a rectangular cuboid. Furthermore, both the front and rear surfaces of the image capture device 100 are rectangular. In other embodiments, the exterior may have a different shape. The image capture device 100 may be made of a rigid material such as plastic, aluminum, steel, or fiberglass. The image capture device 100 may include features other than those described here. For example, the image capture device 100 may include additional buttons or different interface features, such as interchangeable lenses, cold shoes, and hot shoes that can add functional features to the image capture device 100.

The image capture device 100 may include various types of image sensors, such as charge-coupled device (CCD) sensors, active pixel sensors (APS), complementary metal-oxide-semiconductor (CMOS) sensors, N-type metal-oxide-semiconductor (NMOS) sensors, and/or any other image sensor or combination of image sensors.

Although not illustrated, in various embodiments, the image capture device 100 may include other additional electrical components (e.g., an image processor, camera system-on-chip (SoC), etc.), which may be included on one or more circuit boards within the body 102 of the image capture device 100.

The image capture device 100 may interface with or communicate with an external device, such as an external user interface device (not shown), via a wired or wireless computing communication link (e.g., the I/O interface 124). Any number of computing communication links may be used. The computing communication link may be a direct computing communication link or an indirect computing communication link, such as a link including another device or a network, such as the internet, may be used.

In some implementations, the computing communication link may be a Wi-Fi link, an infrared link, a Bluetooth (BT) link, a cellular link, a ZigBee link, a near field communications (NFC) link, such as an ISO/IEC 20643 protocol link, an Advanced Network Technology interoperability (ANT+) link, and/or any other wireless communications link or combination of links.

In some implementations, the computing communication link may be an HDMI link, a USB link, a digital video interface link, a display port interface link, such as a Video Electronics Standards Association (VESA) digital display interface link, an Ethernet link, a Thunderbolt link, and/or other wired computing communication link.

The image capture device 100 may transmit images, such as panoramic images, or portions thereof, to the external user interface device via the computing communication link, and the external user interface device may store, process, display, or a combination thereof the panoramic images.

The external user interface device may be a computing device, such as a smartphone, a tablet computer, a phablet, a smart watch, a portable computer, personal computing device, and/or another device or combination of devices configured to receive user input, communicate information with the image capture device 100 via the computing communication link, or receive user input and communicate information with the image capture device 100 via the computing communication link.

The external user interface device may display, or otherwise present, content, such as images or video, acquired by the image capture device 100. For example, a display of the external user interface device may be a viewport into the three-dimensional space represented by the panoramic images or video captured or created by the image capture device 100.

The external user interface device may communicate information, such as metadata, to the image capture device 100. For example, the external user interface device may send orientation information of the external user interface device with respect to a defined coordinate system to the image capture device 100, such that the image capture device 100 may determine an orientation of the external user interface device relative to the image capture device 100.

Based on the determined orientation, the image capture device 100 may identify a portion of the panoramic images or video captured by the image capture device 100 for the image capture device 100 to send to the external user interface device for presentation as the viewport. In some implementations, based on the determined orientation, the image capture device 100 may determine the location of the external user interface device and/or the dimensions for viewing of a portion of the panoramic images or video.

The external user interface device may implement or execute one or more applications to manage or control the image capture device 100. For example, the external user interface device may include an application for controlling camera configuration, video acquisition, video display, or any other configurable or controllable aspect of the image capture device 100.

The user interface device, such as via an application, may generate and share, such as via a cloud-based or social media service, one or more images, or short video clips, such as in response to user input. In some implementations, the external user interface device, such as via an application, may remotely control the image capture device 100 such as in response to user input.

The external user interface device, such as via an application, may display unprocessed or minimally processed images or video captured by the image capture device 100 contemporaneously with capturing the images or video by the image capture device 100, such as for shot framing or live preview, and which may be performed in response to user input. In some implementations, the external user interface device, such as via an application, may mark one or more key moments contemporaneously with capturing the images or video by the image capture device 100, such as with a tag or highlight in response to a user input or user gesture.

The external user interface device, such as via an application, may display or otherwise present marks or tags associated with images or video, such as in response to user input. For example, marks may be presented in a camera roll application for location review and/or playback of video highlights.

The external user interface device, such as via an application, may wirelessly control camera software, hardware, or both. For example, the external user interface device may include a web-based graphical interface accessible by a user for selecting a live or previously recorded video stream from the image capture device 100 for display on the external user interface device.

The external user interface device may receive information indicating a user setting, such as an image resolution setting (e.g., 3840 pixels by 2160 pixels), a frame rate setting (e.g., 60 frames per second (fps)), a location setting, and/or a context setting, which may indicate an activity, such as mountain biking, in response to user input, and may communicate the settings, or related information, to the image capture device 100.

Figure 7:
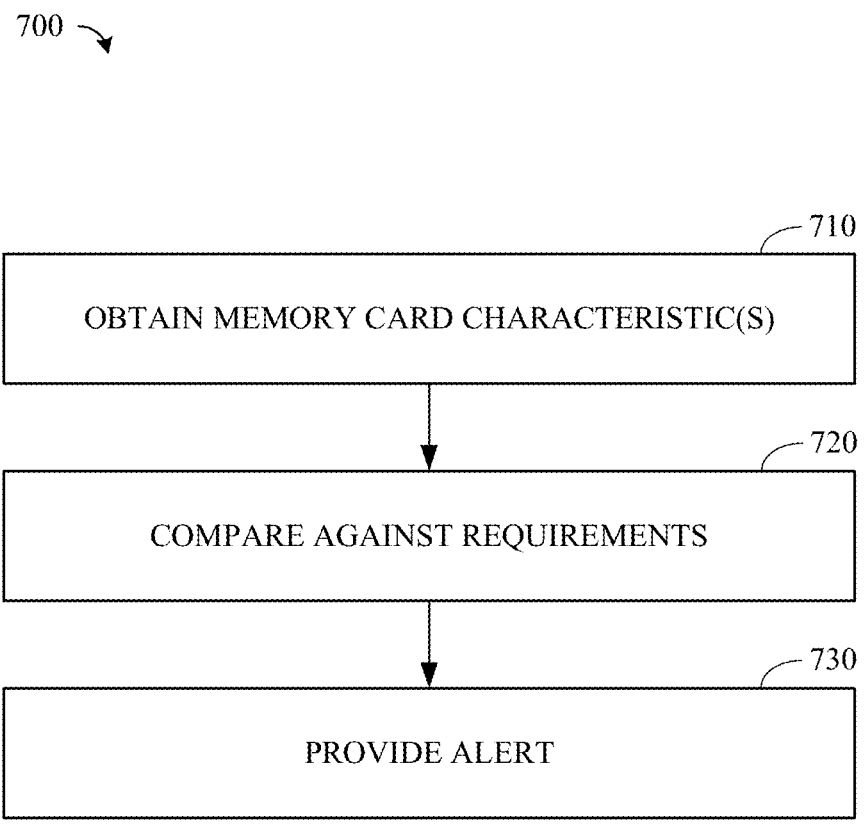
FIG. 7 is a flowchart of detecting memory card performance characteristics.
Figure 8:
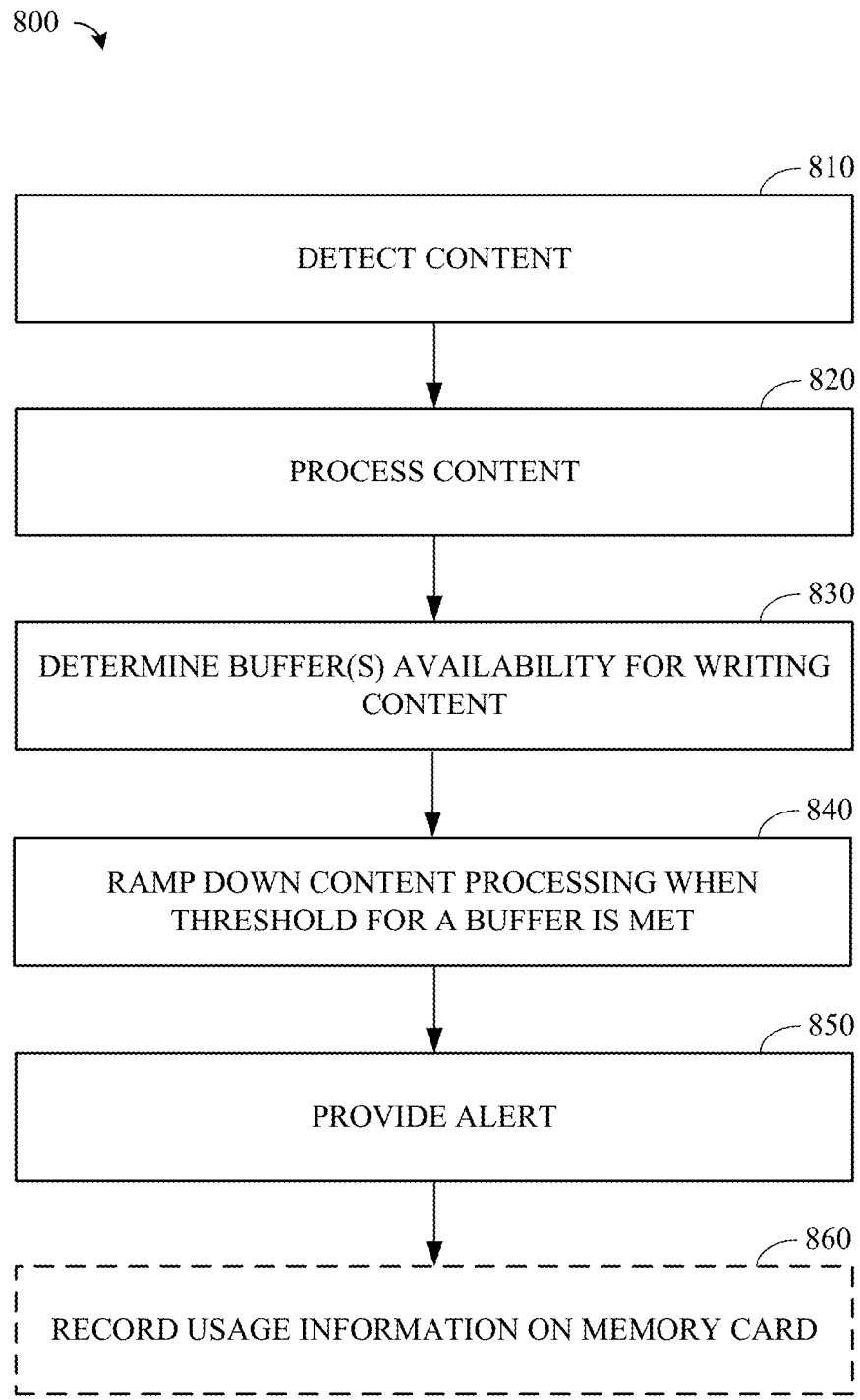
FIG. 8 is a flowchart of monitoring memory card performance characteristics.
Figure 9:
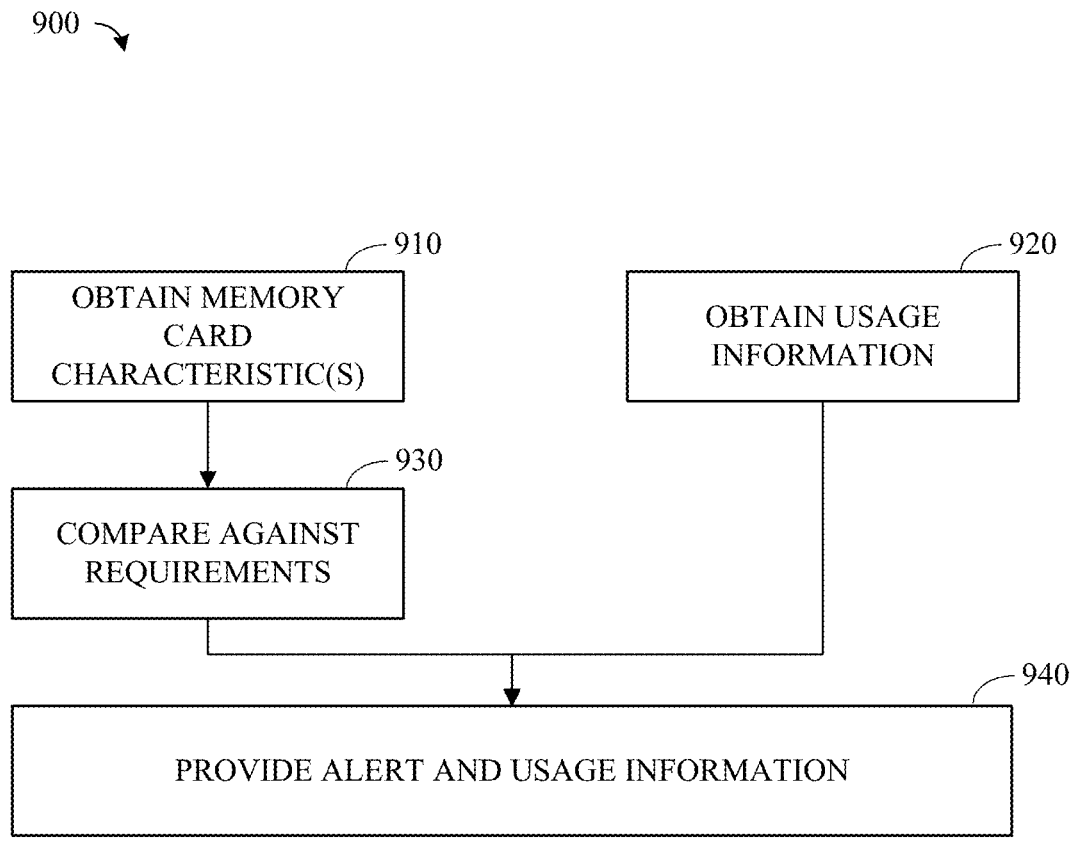
FIG. 9 is a flowchart of detecting memory card performance characteristics.
Figure 10:
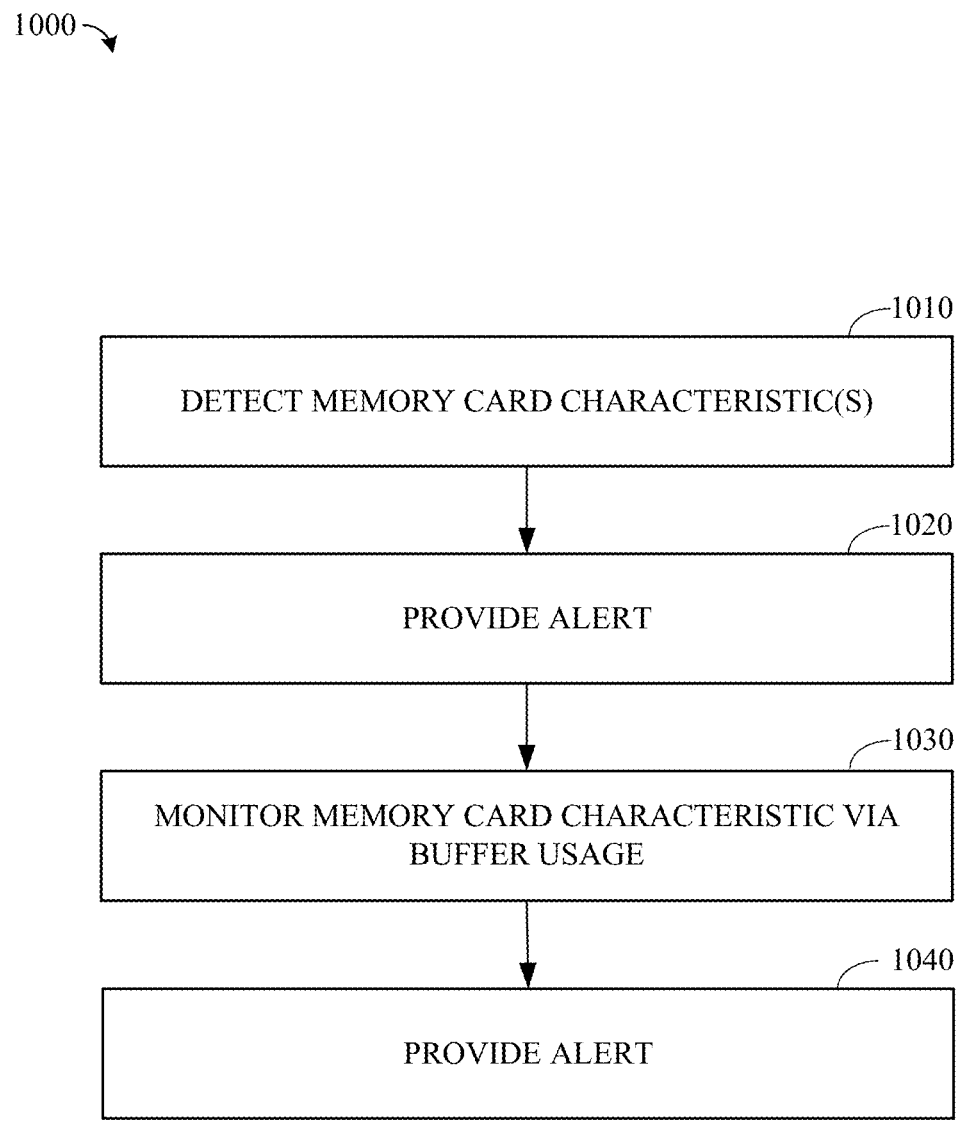
FIG. 10 is a flowchart of detecting and monitoring memory card performance characteristics.

The image capture device 100 may be used to implement some or all of the techniques described in this disclosure, such as the technique 700 described in FIG. 7, the technique 800 described in FIG. 8, the technique 900 described in FIG. 9, and the technique 1000 described in FIG. 10.

Figure 2A:
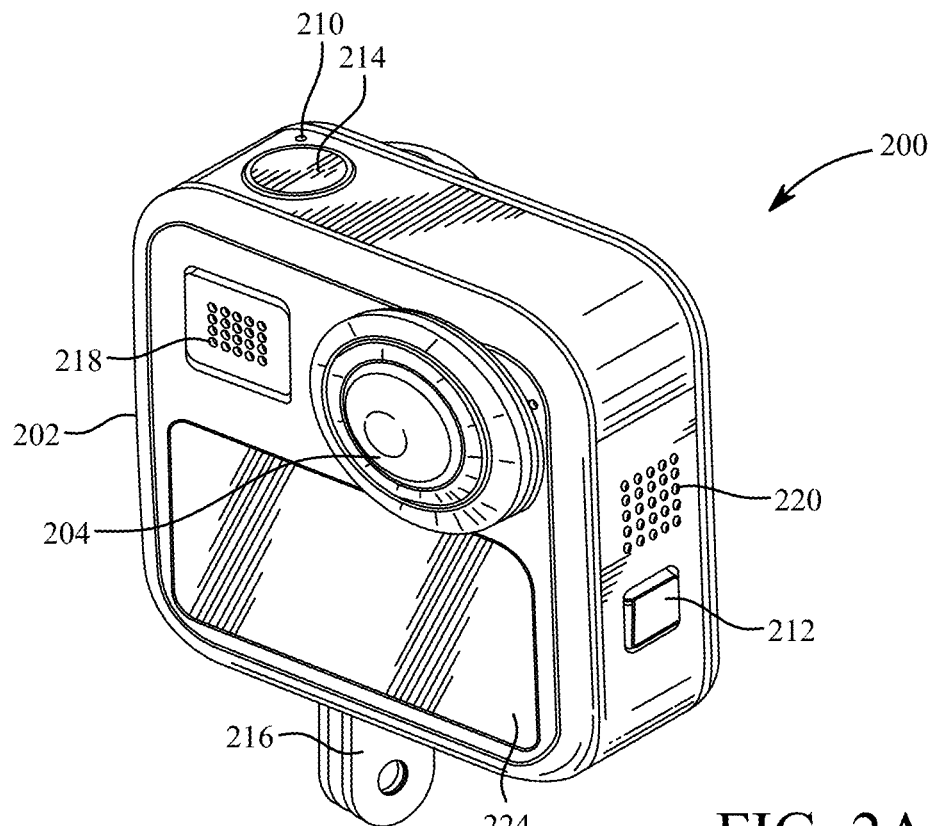
FIGS. 2A-B are isometric views of another example of an image capture device.
Figure 2B:
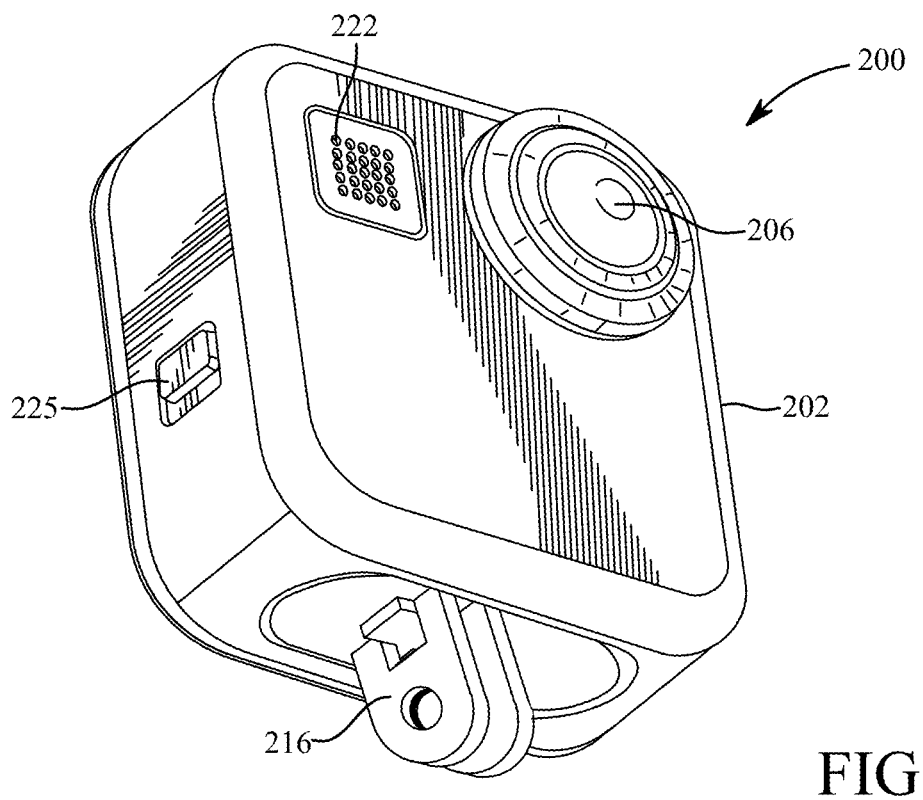

FIGS. 2A-B illustrate another example of an image capture device 200. The image capture device 200 includes a body 202 and two camera lenses 204 and 206 disposed on opposing surfaces of the body 202, for example, in a back-to-back configuration, Janus configuration, or offset Janus configuration. The body 202 of the image capture device 200 may be made of a rigid material such as plastic, aluminum, steel, or fiberglass.

The image capture device 200 includes various indicators on the front of the surface of the body 202 (such as LEDs, displays, and the like), various input mechanisms (such as buttons, switches, and touch-screen mechanisms), and electronics (e.g., imaging electronics, power electronics, etc.) internal to the body 202 that are configured to support image capture via the two camera lenses 204 and 206 and/or perform other imaging functions.

The image capture device 200 includes various indicators, for example, LEDs 208, 210 to indicate a status of the image capture device 100. The image capture device 200 may include a mode button 212 and a shutter button 214 configured to allow a user of the image capture device 200 to interact with the image capture device 200, to turn the image capture device 200 on, and to otherwise configure the operating mode of the image capture device 200. It should be appreciated, however, that, in alternate embodiments, the image capture device 200 may include additional buttons or inputs to support and/or control additional functionality.

The image capture device 200 may include an interconnect mechanism 216 for connecting the image capture device 200 to a handle grip or other securing device. In the example shown in FIGS. 2A and 2B, the interconnect mechanism 216 includes folding protrusions configured to move between a nested or collapsed position (not shown) and an extended or open position as shown that facilitates coupling of the protrusions to mating protrusions of other devices such as handle grips, mounts, clips, or like devices.

The image capture device 200 may include audio components 218, 220, 222 such as microphones configured to receive and record audio signals (e.g., voice or other audio commands) in conjunction with recording video. The audio component 218, 220, 222 can also be configured to play back audio signals or provide notifications or alerts, for example, using speakers. Placement of the audio components 218, 220, 222 may be on one or more of several surfaces of the image capture device 200. In the example of FIGS. 2A and 2B, the image capture device 200 includes three audio components 218, 220, 222, with the audio component 218 on a front surface, the audio component 220 on a side surface, and the audio component 222 on a back surface of the image capture device 200. Other numbers and configurations for the audio components are also possible.

The image capture device 200 may include an interactive display 224 that allows for interaction with the image capture device 200 while simultaneously displaying information on a surface of the image capture device 200. The interactive display 224 may include an I/O interface, receive touch inputs, display image information during video capture, and/or provide status information to a user. The status information provided by the interactive display 224 may include battery power level, memory card capacity, time elapsed for a recorded video, etc.

The image capture device 200 may include a release mechanism 225 that receives a user input to in order to change a position of a door (not shown) of the image capture device 200. The release mechanism 225 may be used to open the door (not shown) in order to access a battery, a battery receptacle, an I/O interface, a memory card interface, etc. (not shown) that are similar to components described in respect to the image capture device 100 of FIGS. 1A and 1B.

In some embodiments, the image capture device 200 described herein includes features other than those described. For example, instead of the I/O interface and the interactive display 224, the image capture device 200 may include additional interfaces or different interface features. For example, the image capture device 200 may include additional buttons or different interface features, such as interchangeable lenses, cold shoes, and hot shoes that can add functional features to the image capture device 200.

Figure 2C:
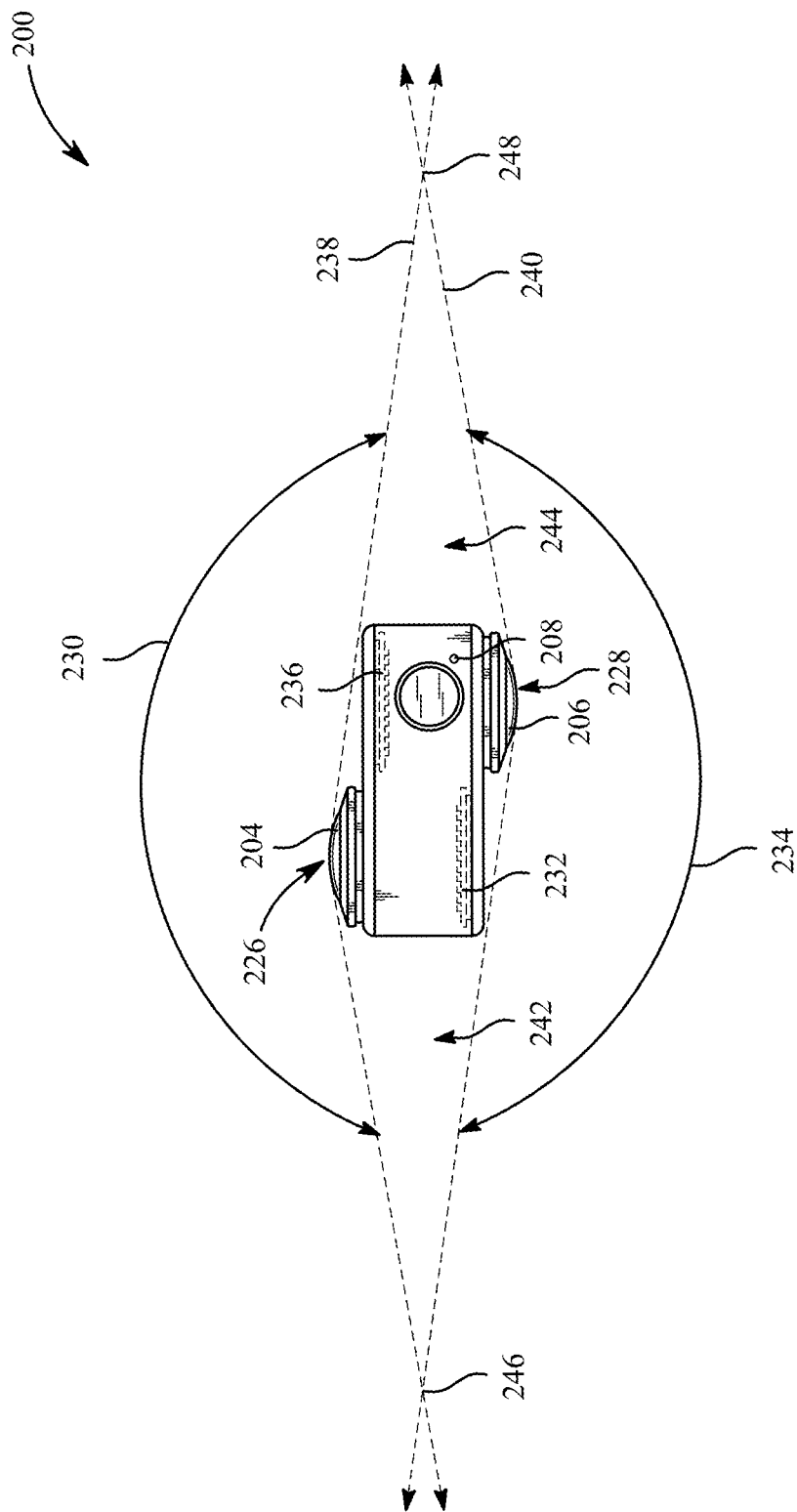
FIG. 2C is a top view of the image capture device of FIGS. 2A-B.
Figure 2D:
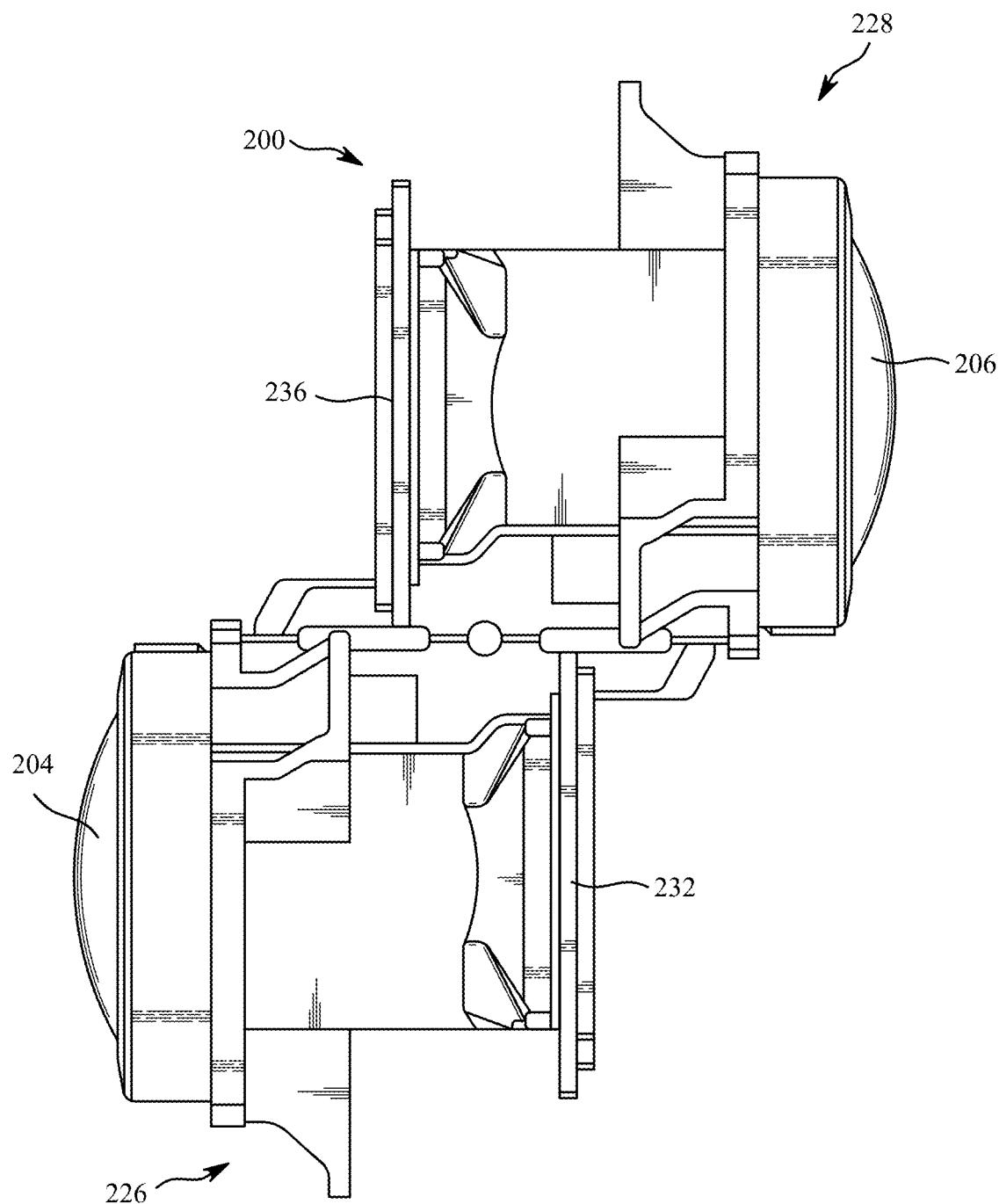
FIG. 2D is a partial cross-sectional view of the image capture device of FIG. 2C.

FIG. 2C is a top view of the image capture device 200 of FIGS. 2A-B and FIG. 2D is a partial cross-sectional view of the image capture device 200 of FIG. 2C. The image capture device 200 is configured to capture spherical images, and accordingly, includes a first image capture device 226 and a second image capture device 228. The first image capture device 226 defines a first field-of-view 230 and includes the lens 204 that receives and directs light onto a first image sensor 232. Similarly, the second image capture device 228 defines a second field-of-view 234 and includes the lens 206 that receives and directs light onto a second image sensor 236. To facilitate the capture of spherical images, the image capture devices 226 and 228 (and related components) may be arranged in a back-to-back (Janus) configuration such that the lenses 204, 206 face in generally opposite directions.

The fields-of-view 230, 234 of the lenses 204, 206 are shown above and below boundaries 238, 240 indicated in dotted line. Behind the first lens 204, the first image sensor 232 may capture a first hyper-hemispherical image plane from light entering the first lens 204, and behind the second lens 206, the second image sensor 236 may capture a second hyper-hemispherical image plane from light entering the second lens 206.

One or more areas, such as blind spots 242, 244 may be outside of the fields-of-view 230, 234 of the lenses 204, 206 so as to define a "dead zone." In the dead zone, light may be obscured from the lenses 204, 206 and the corresponding image sensors 232, 236, and content in the blind spots 242, 244 may be omitted from capture. In some implementations, the image capture devices 226, 228 may be configured to minimize the blind spots 242, 244.

The fields-of-view 230, 234 may overlap. Stitch points 246, 248 proximal to the image capture device 200, that is, locations at which the fields-of-view 230, 234 overlap, may be referred to herein as overlap points or stitch points. Content captured by the respective lenses 204, 206 that is distal to the stitch points 246, 248 may overlap.

Images contemporaneously captured by the respective image sensors 232, 236 may be combined to form a combined image. Generating a combined image may include correlating the overlapping regions captured by the respective image sensors 232, 236, aligning the captured fields-of-view 230, 234, and stitching the images together to form a cohesive combined image.

A slight change in the alignment, such as position and/or tilt, of the lenses 204, 206, the image sensors 232, 236, or both, may change the relative positions of their respective fields-of-view 230, 234 and the locations of the stitch points 246, 248. A change in alignment may affect the size of the blind spots 242, 244, which may include changing the size of the blind spots 242, 244 unequally.

Incomplete or inaccurate information indicating the alignment of the image capture devices 226, 228, such as the locations of the stitch points 246, 248, may decrease the accuracy, efficiency, or both of generating a combined image. In some implementations, the image capture device 200 may maintain information indicating the location and orientation of the lenses 204, 206 and the image sensors 232, 236 such that the fields-of-view 230, 234, the stitch points 246, 248, or both may be accurately determined; the maintained information may improve the accuracy, efficiency, or both of generating a combined image.

The lenses 204, 206 may be laterally offset from each other, may be off-center from a central axis of the image capture device 200, or may be laterally offset and off-center from the central axis. As compared to image capture devices with back-to-back lenses, such as lenses aligned along the same axis, image capture devices including laterally offset lenses may include substantially reduced thickness relative to the lengths of the lens barrels securing the lenses. For example, the overall thickness of the image capture device 200 may be close to the length of a single lens barrel as opposed to twice the length of a single lens barrel as in a back-to-back lens configuration. Reducing the lateral distance between the lenses 204, 206 may improve the overlap in the fields-of-view 230, 234. In another embodiment (not shown), the lenses 204, 206 may be aligned along a common imaging axis.

Images or frames captured by the image capture devices 226, 228 may be combined, merged, or stitched together to produce a combined image, such as a spherical or panoramic image, which may be an equirectangular planar image. In some implementations, generating a combined image may include use of techniques including noise reduction, tone mapping, white balancing, or other image correction. In some implementations, pixels along the stitch boundary may be matched accurately to minimize boundary discontinuities.

The image capture device 200 may be used to implement some or all of the techniques described in this disclosure, such as the technique 700 described in FIG. 7, the technique 800 described in FIG. 8, the technique 900 described in FIG. 9, and the technique 1000 described in FIG. 10.

Figure 3:
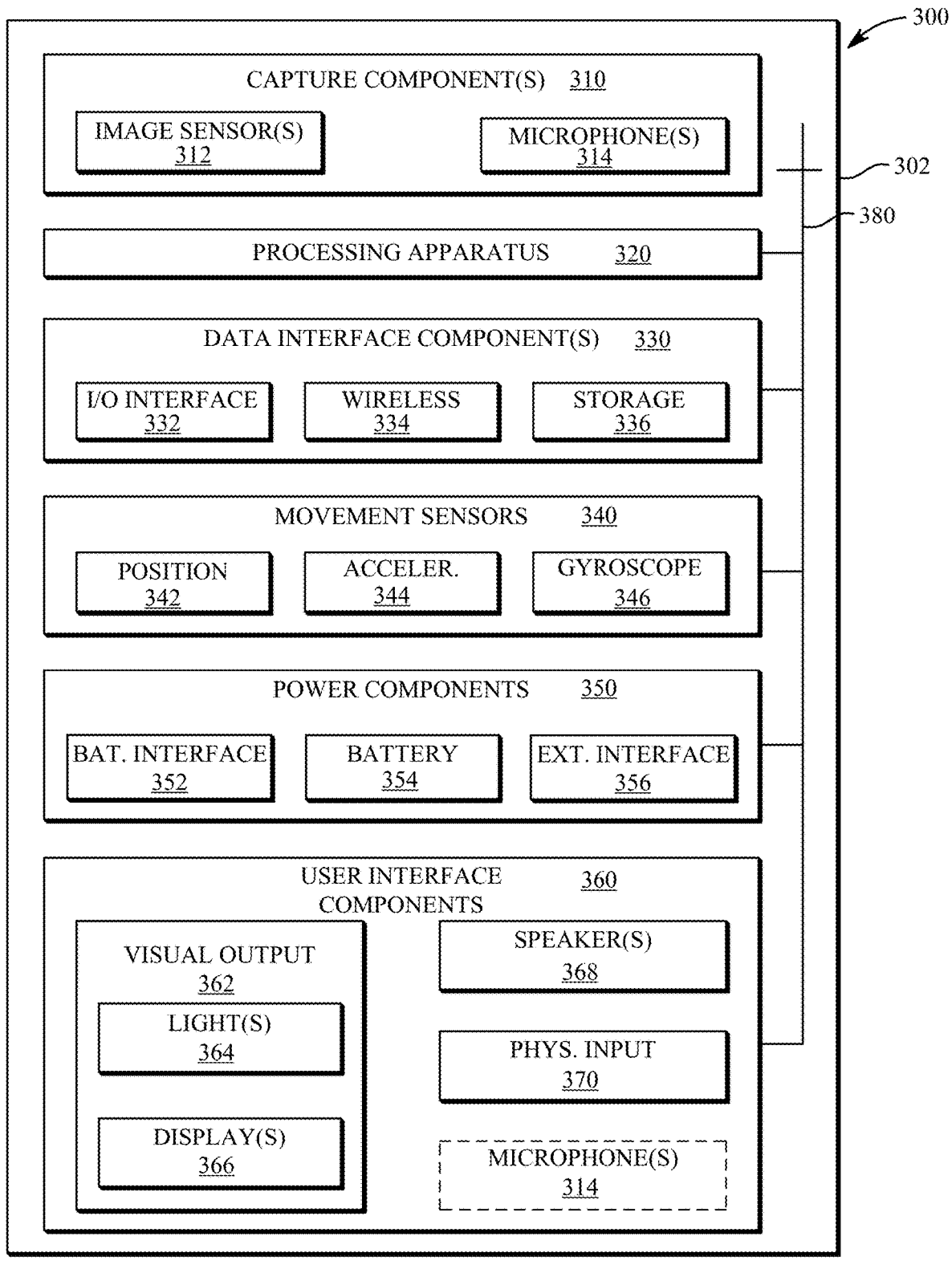
FIG. 3 is a block diagram of electronic components of an image capture device.

FIG. 3 is a block diagram of electronic components in an image capture device 300. The image capture device 300 may be a single-lens image capture device, a multi-lens image capture device, or variations thereof, including an image capture device with multiple capabilities such as use of interchangeable integrated sensor lens assemblies. The description of the image capture device 300 is also applicable to the image capture devices 100, 200 of FIGS. 1A-B and 2A-D.

The image capture device 300 includes a body 302 which includes electronic components such as capture components 310, a processing apparatus 320, data interface components 330, movement sensors 340, power components 350, and/or user interface components 360.

The capture components 310 include one or more image sensors 312 for capturing images and one or more microphones 314 for capturing audio.

The image sensor(s) 312 is configured to detect light of a certain spectrum (e.g., the visible spectrum or the infrared spectrum) and convey information constituting an image as electrical signals (e.g., analog or digital signals). The image sensor(s) 312 detects light incident through a lens coupled or connected to the body 302. The image sensor(s) 312 may be any suitable type of image sensor, such as a charge-coupled device (CCD) sensor, active pixel sensor (APS), complementary metal-oxide-semiconductor (CMOS) sensor, N-type metal-oxide-semiconductor (NMOS) sensor, and/or any other image sensor or combination of image sensors. Image signals from the image sensor(s) 312 may be passed to other electronic components of the image capture device 300 via a bus 380, such as to the processing apparatus 320. In some implementations, the image sensor(s) 312 includes a digital-to-analog converter. A multi-lens variation of the image capture device 300 can include multiple image sensors 312.

The microphone(s) 314 is configured to detect sound, which may be recorded in conjunction with capturing images to form a video. The microphone(s) 314 may also detect sound in order to receive audible commands to control the image capture device 300.

The processing apparatus 320 may be configured to perform image signal processing (e.g., filtering, tone mapping, stitching, and/or encoding) to generate output images based on image data from the image sensor(s) 312. The processing apparatus 320 may include one or more processors having single or multiple processing cores. In some implementations, the processing apparatus 320 may include an application specific integrated circuit (ASIC). For example, the processing apparatus 320 may include a custom image signal processor. The processing apparatus 320 may exchange data (e.g., image data) with other components of the image capture device 300, such as the image sensor(s) 312, via the bus 380.

The processing apparatus 320 may include memory, such as a random-access memory (RAM) device, flash memory, or another suitable type of storage device, such as a non-transitory computer-readable memory. The memory of the processing apparatus 320 may include executable instructions and data that can be accessed by one or more processors of the processing apparatus 320. For example, the processing apparatus 320 may include one or more dynamic random-access memory (DRAM) modules, such as double data rate synchronous dynamic random-access memory (DDR SDRAM). In some implementations, the processing apparatus 320 may include a digital signal processor (DSP). More than one processing apparatus may also be present or associated with the image capture device 300.

The data interface components 330 enable communication between the image capture device 300 and other electronic devices, such as a remote control, a smartphone, a tablet computer, a laptop computer, a desktop computer, or a storage device. For example, the data interface components 330 may be used to receive commands to operate the image capture device 300, transfer image data to other electronic devices, and/or transfer other signals or information to and from the image capture device 300. The data interface components 330 may be configured for wired and/or wireless communication. For example, the data interface components 330 may include an I/O interface 332 that provides wired communication for the image capture device, which may be a USB interface (e.g., USB type-C), a high-definition multimedia interface (HDMI), or a FireWire interface. The data interface components 330 may include a wireless data interface 334 that provides wireless communication for the image capture device 300, such as a Bluetooth interface, a ZigBee interface, and/or a Wi-Fi interface. The data interface components 330 may include a storage interface 336, such as a memory card slot configured to receive and operatively couple to a storage device (e.g., a memory card) for data transfer with the image capture device 300 (e.g., for storing captured images and/or recorded audio and video).

The movement sensors 340 may detect the position and movement of the image capture device 300. The movement sensors 340 may include a position sensor 342, an accelerometer 344, or a gyroscope 346. The position sensor 342, such as a global positioning system (GPS) sensor, is used to determine a position of the image capture device 300. The accelerometer 344, such as a three-axis accelerometer, measures linear motion (e.g., linear acceleration) of the image capture device 300. The gyroscope 346, such as a three-axis gyroscope, measures rotational motion (e.g., rate of rotation) of the image capture device 300. Other types of movement sensors 340 may also be present or associated with the image capture device 300.

The power components 350 may receive, store, and/or provide power for operating the image capture device 300. The power components 350 may include a battery interface 352 and a battery 354. The battery interface 352 operatively couples to the battery 354, for example, with conductive contacts to transfer power from the battery 354 to the other electronic components of the image capture device 300. The power components 350 may also include an external interface 356, and the power components 350 may, via the external interface 356, receive power from an external source, such as a wall plug or external battery, for operating the image capture device 300 and/or charging the battery 354 of the image capture device 300. In some implementations, the external interface 356 may be the I/O interface 332. In such an implementation, the I/O interface 332 may enable the power components 350 to receive power from an external source over a wired data interface component (e.g., a USB type-C cable).

The user interface components 360 may allow the user to interact with the image capture device 300, for example, providing outputs to the user and receiving inputs from the user. The user interface components 360 may include visual output components 362 to visually communicate information and/or present captured images to the user. The visual output components 362 may include one or more lights 364 and/or more displays 366. The display(s) 366 may be configured as a touch screen that receives inputs from the user. The user interface components 360 may also include one or more speakers 368. The speaker(s) 368 can function as an audio output component that audibly communicates information and/or presents recorded audio to the user. The user interface components 360 may also include one or more physical input interfaces 370 that are physically manipulated by the user to provide input to the image capture device 300. The physical input interfaces 370 may, for example, be configured as buttons, toggles, or switches. The user interface components 360 may also be considered to include the microphone(s) 314, as indicated in dotted line, and the microphone(s) 314 may function to receive audio inputs from the user, such as voice commands.

The image capture device 300 may be used to implement some or all of the techniques described in this disclosure, such as the technique 700 described in FIG. 7, the technique 800 described in FIG. 8, the technique 900 described in FIG. 9, and the technique 1000 described in FIG. 10.

Figure 4:
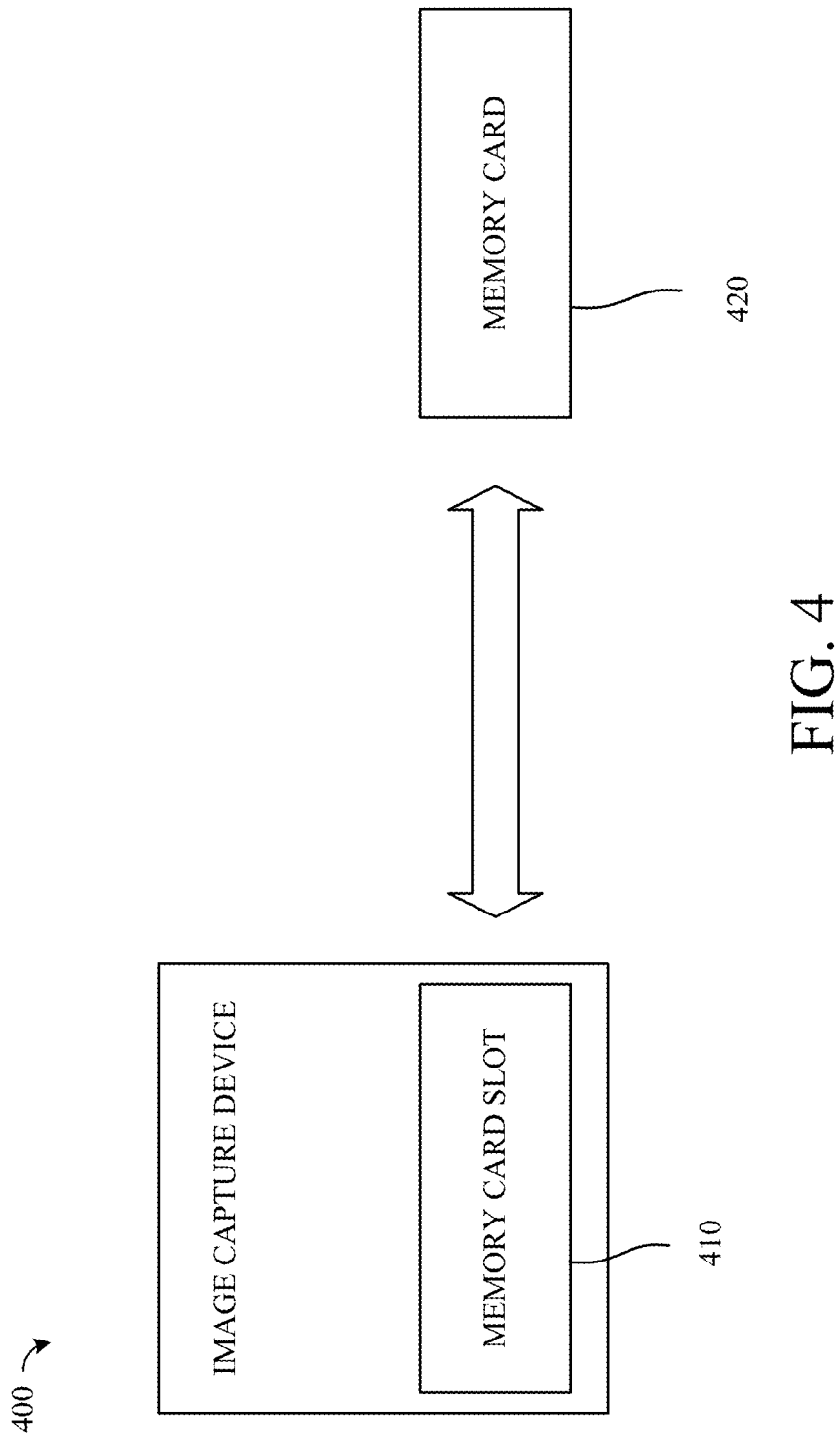
FIG. 4 is a block diagram of an image capture device and a memory card.

FIG. 4 is a block diagram of an image capture device 400. The image capture device 400 may be the image capture device 100 shown in FIGS. 1A-B, the image capture device 200 shown in FIGS. 2A-C, or the image capture device 300 shown in FIG. 3. The image capture device 400 may include a memory card slot 410 configured to receive and operatively couple to a memory card 420 for data transfer with the image capture device 400 (e.g., for storing captured images and/or recorded audio and video). Memory cards, such as the memory card 420, may have written or stated operating or performance characteristics.

Figure 5:
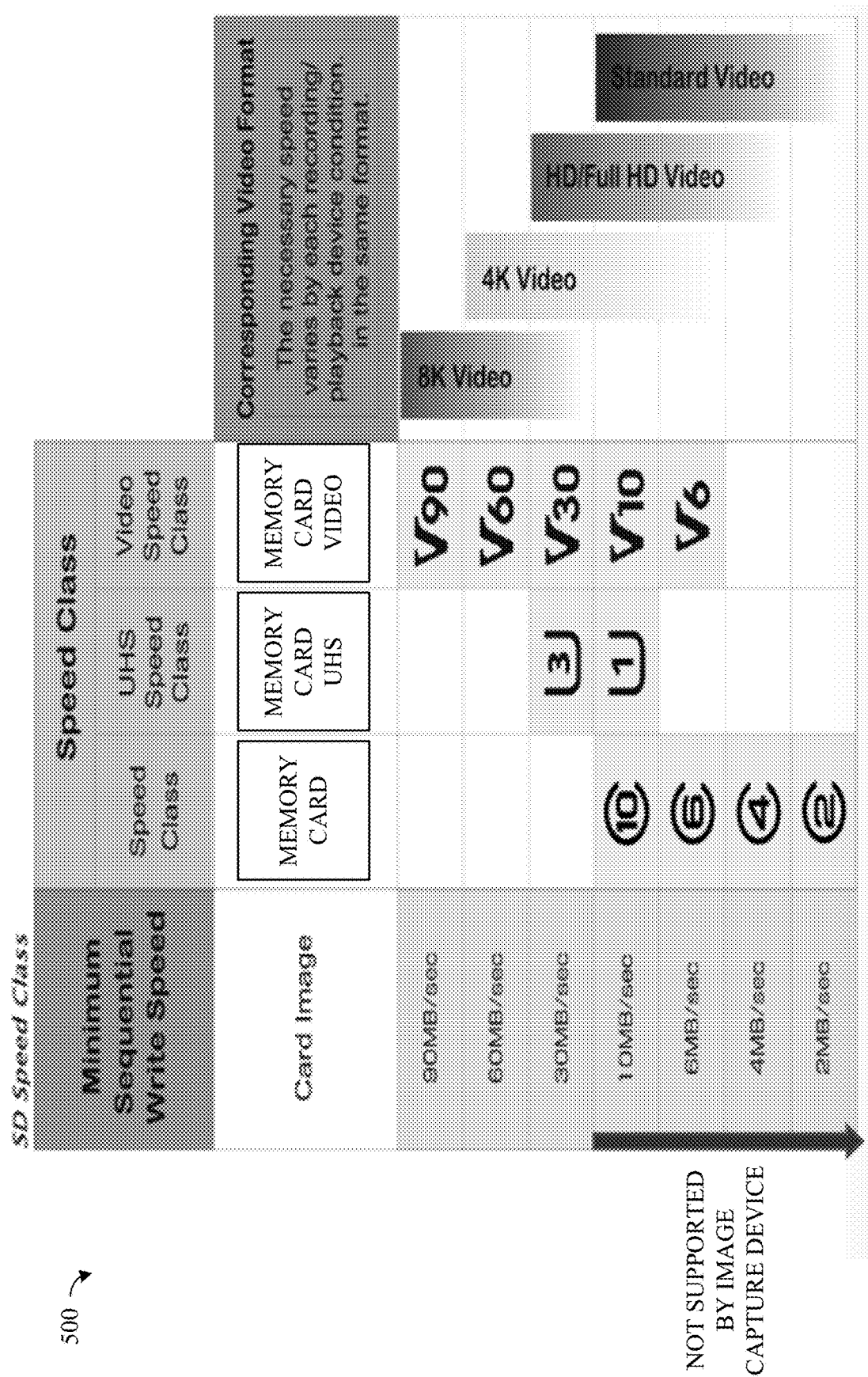
FIG. 5 is a diagram of memory card performance characteristics.

FIG. 5 is a diagram 500 of memory card performance characteristics. The stated performance characteristics can include, for example, access speed mode, transfer speed mode, speed grade, speed class, or combinations thereof. The access speed mode or transfer speed mode is the bus speed at which the memory card 420 may operate. The access speed mode may include, but is not limited to, default speed (DS), high speed (HS), SDR12, SDR25, SDR50, or SDR104. The speed grade or speed class is the write speed at which the memory card 420 may operate. The speed class may include, but is not limited to, speed class, UHS speed class, or video speed class. The speed class ratings may include 2, 4, 6, and 10, which represent 2 MB/sec, 4 MB/sec, 6 MB/sec, and 10 MB/sec. The UHS speed class may include two grades, represented by a U followed by a number, including 10 MB/sec and 30 MB/sec. The video speed class may include multiple sequential writing speeds, represented by a V followed by a number, including 6 MB/sec, 10 MB/sec, 30 MB/sec, 60 MB/sec, and 90 MB/sec. Image capture devices, such as the image capture device 400 of FIG. 4, may have a requirement for a minimum write speed for a sustained period of time to support capturing of videos or fast time lapses. In FIG. 5, for example, memory cards which do not have writing speeds of at least 30 MB/sec may not meet the minimum write speed for the image capture device 400 and errors or abrupt stoppage may occur during processing.

The memory card performance characteristics are stored on the memory card as metadata or defined memory card performance information. The image capture device 400 or firmware in the image capture device 400 may access and obtain the metadata during memory card initialization. The obtained metadata may be compared against image capture device minimum requirements. Based on the comparison, the image capture device 400 may provide an alert on an interactive display such as the interactive display 138 or interactive display 224 to indicate that the inserted memory card 420 may not perform adequately during processing.

Although the metadata may indicate that the memory card 420 meets the image capture device minimum requirements, the memory card 420 may not operationally meet the image capture device minimum requirements due to age, usage, or being a counterfeit. Abrupt stoppage may occur during content processing if the memory card 420 is operationally below the image capture device minimum requirements. Therefore, the image capture device 400 may include operational monitoring of buffers in the image capture device 400 to determine or infer the memory card performance characteristics during content processing.

Figure 6:
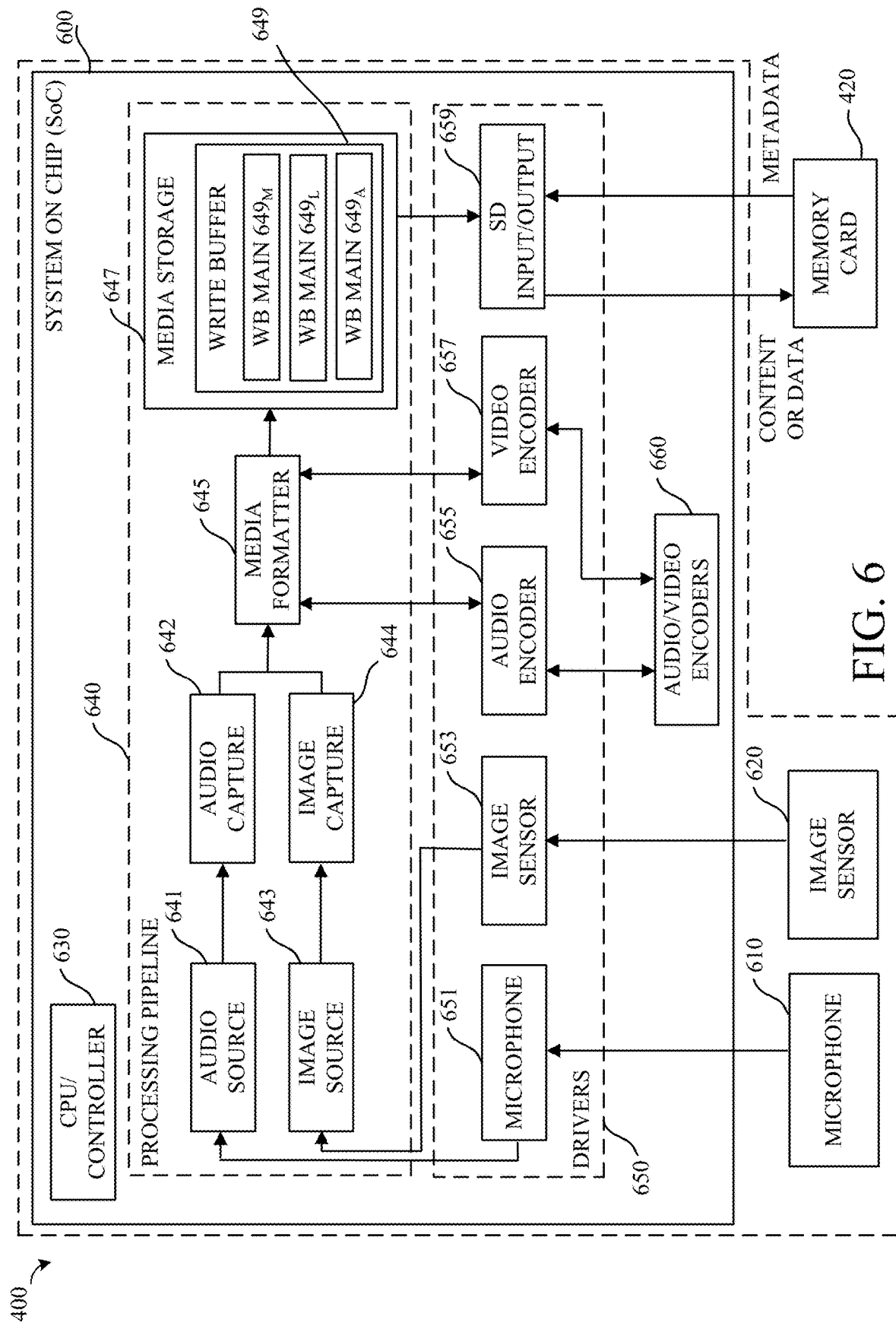
FIG. 6 is a flow diagram of an image capture device operating with a memory card.

FIG. 6 is a flow diagram of the image capture device 400 operating with the memory card 420 of FIG. 4. The image capture device 400 may include a system on chip (SoC) 600, a microphone 610, and an image sensor 620. The SoC 600 may include a CPU or controller 630, a processing pipeline 640, drivers 650, and audio and video encoders 660. The processing pipeline 640 may include an audio source 641 connected to an audio capture 642, and an image source 643 connected to a video capture 644. The audio capture 642 and the video capture 644 may be connected to a media formatter 645, which in turn may be connected to a media storage 647. The media storage 647 may include write buffers 649. In implementations, the write buffers 649 may include main resolution buffers (WB MAIN) $649_M$, low resolution buffers (WB LOW) $649_L$, and audio buffers (WB AUDIO) $649_A$. The drivers 650 may include a microphone driver 651 connecting the audio source 641 and the microphone 610, an image sensor driver 653 connecting the image sensor 620 and the image source 643, an audio encoder driver 655 connecting an audio encoder in the audio and video encoders 660 to the media formatter 645, a video encoder driver 657 connecting a video encoder in the audio and video encoders 660 to the media formatter 645, and a SD input/output (SDIO) driver 659 connecting the memory card 420 to the media storage 647.

Operationally, the CPU or controller 630 is configured to orchestrate or control data flow from the detecting, processing, and writing of the content to the memory card 420. The image sensor 620 is configured to detected image content including video content and send the detected image content to the image source 643 via the image sensor driver 653. Similarly, when available, the microphone 610 is configured to detect audio content and send the detected audio content to the audio source 641 via the microphone driver 651. The image source 643 and the image capture 644 are configured to process the detected image content and send processed image content to the media formatter 645. The audio source 641 and the audio capture 642 are configured to process the detected audio content and send processed audio content to the media formatter 645. The media formatter 645 is configured to send the processed image content and the processed audio content to the audio/video encoders 660 via the audio encoder driver 655 and the video encoder driver 657, respectively. The audio/video encoders 660 are configured to encode the processed image content and the processed audio content and send encoded image content and encoded audio content to the media formatter 645 via the audio encoder driver 655 and the video encoder driver 657, respectively. The media formatter 645 is configured to write multiplexed encoded image content and encoded audio content ("multiplexed content") to the media storage 647.

At a high level, the media storage 647 is configured to write the multiplexed content or data out to the memory card 420. Each of the write buffers 649 is configured to accumulate the appropriate multiplexed content from the media formatter 645 and write the appropriate multiplexed content out to the memory card 420. During the encoding process, the image capture device 400 is configured to write three types of files as represented by the WB MAIN $649_M$, the WB LOW $649_L$, and the WB AUDIO $649_A$, where the WB MAIN $649_M$ is for full resolution content, the WB LOW $649_L$ is for low resolution content, and the WB AUDIO $649_A$ is for audio content. Each of the WB MAIN $649_M$, the WB LOW $649_L$, and the WB AUDIO $649_A$ have an assigned or allocated number of buffers. The assigned or allocated number of buffers may be different for each buffer type. If the write performance of the memory card 420 is slow or does not meet the image capture device minimum requirements, then one or more of the write buffers will overflow and the image capture device will stop abruptly.

To address this issue, the CPU or controller 630 is configured to determine what percentage or how many of the allocated buffers for each buffer type are being used ("used buffer metric"). The CPU or controller 630 is configured to track and compare the used buffer metric for each buffer type against a performance threshold. In implementations, the performance threshold may be different for each buffer type. If the performance threshold is met or exceeded for any one of the buffer types, e.g., the WB MAIN $649_M$, the WB LOW $649_L$, and the WB AUDIO $649_A$, then the CPU or controller 630 is configured to gracefully or gradually decrease and eventually stop content processing or encoding. The CPU or controller 630 is configured to provide an alert to user. In implementations, alert can be visual, audio, or combinations thereof. The gradual stoppage and the alert notification may be near simultaneous so that the user can react accordingly. In implementations, the performance threshold is 80% or an equivalent number of the allocated buffers.

In implementations, the CPU or controller 630 can write memory card performance information to a file in the memory card 420. For example, this can include the used buffer metric for each buffer type, timestamp of initial use, number of writings, and other related information. The file can then be read by the CPU or controller 630 the next time the memory card 420 is inserted in an image capture device. The memory card performance information can be provided to the user or provide an alert as to the status of the memory card 420 by comparing the stored metrics against performance thresholds.

FIG. 7 is a flowchart of an example technique 700 for detecting memory card performance characteristics. The technique 700 includes: obtaining 710 memory card characteristics; comparing 720 the memory card characteristics against requirements; and providing 730 alerts to a user. For example, the technique 700 may be implemented by the image capture device 100 shown in FIGS. 1A-1B, the image capture device 200 shown in FIGS. 2A-2D, the image capture device 300 shown in FIG. 3, or the image capture device 400 of FIG. 4.

The technique 700 includes obtaining 710 memory card characteristics. A memory card may be inserted into an image capture device. The image capture device may read or retrieve memory card characteristics or metadata stored on the memory card.

The technique 700 includes comparing 720 the memory card characteristics against performance thresholds. The image capture device may compare the retrieved memory card characteristics against image capture device requirements to ensure content processing or encoding may be performed without impacting content or image capture device functionality.

The technique 700 includes providing 730 alerts to a user. The image capture device can provide visual alerts, audio alerts, or combinations thereof if the retrieved memory card characteristics does not meet or fails to match the image capture device requirements. This notifies the user that continued use of the inserted memory card may impact content processing or writing of the content to the memory card.

FIG. 8 is a flowchart of an example technique 800 for monitoring memory card performance characteristics. The technique 8000 includes: detecting 810 content; processing 820 content; determining 830 buffer availability for writing content; ramping 840 down content processing when threshold for a buffer is met; and providing 850 an alert. In implementations, the technique 800 includes recording 860 usage information on memory card. For example, the technique 800 may be implemented by the image capture device 100 shown in FIGS. 1A-1B, the image capture device 200 shown in FIGS. 2A-2D, the image capture device 300 shown in FIG. 3, or the image capture device 400 of FIG. 4. For example, the technique 800 may be implemented in addition to the technique 700 described in FIG. 7.

The technique 800 includes detecting 810 content. Content may include image content including video content, audio content, and combinations thereof. An image sensor in an image capture device may detect the image content including the video content. A microphone in the image capture device may detect the audio content.

The technique 800 includes processing 820 content. The image capture device may process the detected content in an image processing path and in an audio processing path. The processing may include encoding the image content and the audio content using video and audio encoders, respectively.

The technique 800 includes determining 830 buffer availability for writing content. The encoded content may be written to one or more buffers. Each of the buffers is checked for usage levels. The usage level of each of the one or more buffers is compared against a performance threshold.

The technique 800 includes ramping 840 down content processing when threshold for a buffer is met. If the usage level of one of the one or more buffers meets or exceeds the performance threshold, then content processing is gradually shut down.

The technique 800 includes providing 850 an alert. A visual or audio alert is provided to indicate impending content processing stoppage due to memory card issue.

In implementations, the technique 800 includes recording 860 usage information on the memory card. The image capture device can save memory card usage metrics or statistics in the memory card. This may be used the next time that the memory card is used in an image capture device to alert the user of the memory card usage or any issues.

FIG. 9 is a flowchart of an example technique 900 for detecting memory card performance characteristics. The technique 900 includes: obtaining 910 memory card characteristics; obtaining 920 memory card usage information; comparing 930 the memory card characteristics against requirements; and providing 940 alerts to a user. For example, the technique 900 may be implemented by the image capture device 100 shown in FIGS. 1A-1B, the image capture device 200 shown in FIGS. 2A-2D, the image capture device 300 shown in FIG. 3, or the image capture device 400 of FIG. 4. For example, the technique 900 may be implemented in addition to the technique 700 described in FIG. 7 and to the technique 800 described in FIG. 8.

The technique 900 includes obtaining 910 memory card characteristics. A memory card may be inserted into an image capture device. The image capture device may read or retrieve memory card characteristics or metadata stored on the memory card.

The technique 900 includes obtaining 920 memory card usage information. The image capture device can save memory card usage metrics or statistics in the memory card. This may be retrieved by an image capture device when the memory card is used the next time.

The technique 900 includes comparing 930 the memory card characteristics against performance thresholds. The image capture device may compare the retrieved memory card characteristics against image capture device requirements to ensure content processing or encoding may be performed without impacting content or image capture device functionality.

The technique 900 includes providing 940 alerts to a user. The image capture device can provide visual alerts, audio alerts, or combinations thereof if the retrieved memory card characteristics does not meet the image capture device requirements to notify the user that continued use of the inserted memory card may impact content processing or writing of the content to the memory card. The image capture device can provide visual alerts, audio alerts, or combinations thereof with respect to the memory card usage information.

FIG. 10 is a flowchart of an example technique 1000 for detecting and monitoring memory card performance characteristics. The technique includes detecting 1010 memory card characteristics; providing 1020 alerts to a user; monitoring 1030 memory card characteristics via buffer usage; and providing 1040 alerts to a user. For example, the technique 1000 may be implemented by the image capture device 100 shown in FIGS. 1A-1B, the image capture device 200 shown in FIGS. 2A-2D, the image capture device 300 shown in FIG. 3, or the image capture device 400 of FIG. 4. For example, the technique 1000 may be implemented in addition to the technique 700 described in FIG. 7, the technique 800 described in FIG. 8, and the technique 900 described in FIG. 9.

The technique 1000 includes detecting 1010 memory card characteristics. A memory card may be inserted into an image capture device. The image capture device may read or retrieve memory card characteristics or metadata stored on the memory card. The image capture device may compare the retrieved memory card characteristics against image capture device requirements to ensure content processing or encoding may be performed without impacting content or image capture device functionality.

The technique 1000 includes providing 1020 alerts to a user. The image capture device may provide visual alerts, audio alerts, or combinations thereof if the retrieved memory card characteristics does not meet the image capture device requirements to notify the user that continued use of the inserted memory card may impact content processing or writing of the content to the memory card. In implementations, the image capture device can retrieve saved memory card usage metrics, statistics, or information from the memory card. This information may be used to generate alerts.

The technique 1000 includes monitoring 1030 memory card characteristics via buffer usage. The image capture device may detect content including image content and audio content. The image content and the audio content may be processed by the image capture device. The processed content may be written to different buffer types. Each of the buffer types is checked for buffer usage levels. In other words, buffers used for accumulating processed content prior to writing to the memory card are monitored for buffer usage levels. Content processing is gradually phased off or shut down when a buffer usage level of one or more of the buffer types is at or greater than a buffer usage threshold.

The technique 1000 includes providing 1040 alerts to a user. A visual or audio alert is provided to indicate impending processing stoppage due to memory card issue. In implementations, the technique 1000 includes recording the buffer usage level on the memory card. This may be used the next time that the memory card is used in an image capture device to alert the user of the memory card usage or any issues.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A method for detecting memory card performance characteristics, the method comprising:
    obtaining at least one memory card performance characteristic from a memory card when the memory card is inserted in an image capture device;
    determining whether the at least one memory card performance characteristic meets a defined image capture device requirement;
    providing an alert when the at least one memory card performance characteristic fails to match the defined image capture device requirement; and
    recording buffer usage levels of one or more buffers in the image capture device on the memory card.

2. The method of claim 1, wherein the at least one memory card performance characteristic is speed class or video speed class.

3. The method of claim 1, wherein the alert is at least one of a visual alert or an audible alert.

4. The method of claim 1, further comprising:
    processing content detected by the image capture device;
    writing the processed content to at least one buffer type;
    checking if a buffer usage level of the at least one buffer type meets a buffer usage threshold;
    gradually shutting down content processing when the at least one buffer type meets a buffer usage threshold; and
    providing an alert when the at least one buffer type meets the buffer usage threshold.

5. The method of claim 4, wherein the content is image content.

6. The method of claim 1,
    wherein the one or more buffers include buffers for different types of content.

7. The method of claim 1, further comprising:
    retrieving the recorded buffer usage levels of one or more buffers in the image capture device from the memory card when the memory card is inserted in the image capture device; and
    providing an alert based on the retrieved buffer usage levels, wherein buffers for different types of content have different threshold levels.

8. The method of claim 1, further comprising:
    monitoring buffer usage levels of different buffers in the image capture device used for accumulating processed content prior to writing to the memory card;
    comparing the buffer usage levels for the different buffers against appropriate buffer usage thresholds;
    ramping down content processing when a buffer usage level for one of the different buffers meets an appropriate buffer usage threshold; and
    providing an alert when the buffer usage level meets the appropriate buffer usage threshold.

9. A method for detecting and monitoring memory card performance characteristics, the method comprising:
    obtaining at least one memory card performance characteristic from a memory card when the memory card is inserted in an image capture device;
    determining whether the at least one memory card performance characteristic meets a defined image capture device requirement;
    monitoring buffer usage levels of different buffers in the image capture device used for accumulating processed content prior to writing the processed content to the memory card, wherein each of the different buffers has a different buffer usage threshold; and
    providing an alert when the at least one memory card performance characteristic fails to match the defined image capture device requirement or when a buffer usage level for one of the different buffers meets an appropriate buffer usage threshold.

10. The method of claim 9, further comprising:
    processing content detected by the image capture device;
    writing the processed content to at least one of the different buffers; and
    comparing the buffer usage levels for the different buffers against the appropriate buffer usage threshold.

11. The method of claim 10, further comprising:
    Gradually shutting down content processing when at least one of the buffer usage levels meets the respective appropriate buffer usage threshold.

12. The method of claim 9, wherein the at least one memory card performance characteristic is speed class or video speed class.

13. The method of claim 9, wherein the alert is at least one of a visual alert or an audible alert.

14. The method of claim 9, wherein the content is image content.

15. The method of claim 9, further comprising:
    storing the buffer usage levels on the memory card.

16. The method of claim 15, further comprising:
    obtaining the buffer usage levels from the memory card when the memory card is inserted in the image capture device; and
    providing an alert based on the obtained buffer usage levels and appropriate buffer usage thresholds.

17. An image capture device, comprising:
    a memory card slot configured to receive a memory card; and
    a processor configured to:

retrieve memory card metadata from an inserted memory card;

check whether the memory card metadata meets an image capture device processing requirement;

generate an alert when the memory card metadata fails to match the image capture device processing requirement; and store buffer usage levels of write buffers in the image capture device on the memory card when using the memory card in the image capture device.

18. The image capture device of claim 17, further comprising:

the write buffers configured to receive and accumulate processed content detected by the image capture device; and the processor is further configured to:

track buffer usage levels of the write buffers;

compare the buffer usage levels for the write buffers against a buffer usage threshold;

ramp down content processing when a buffer usage level for one of the write buffers meets the buffer usage threshold; and generate an alert when the buffer usage level meets the buffer usage threshold.

19. The image capture device of claim 18, wherein the write buffers have different buffer usage thresholds for different write buffer types.

20. The image capture device of claim 19, wherein the processor is further configured to:

obtain the buffer usage levels from the memory card when the memory card is inserted in the image capture device; and generate an alert based on the obtained buffer usage levels.

* * * * *

UNITED STATES PATENT AND TRADEMARK OFFICE
CERTIFICATE OF CORRECTION

| | | |
|---|---|---|
| PATENT NO. | : 11,985,445 B2 | Page 1 of 1 |
| APPLICATION NO. | : 17/678414 | |
| DATED | : May 14, 2024 | |
| INVENTOR(S) | : Naveen Chinya Krishnamurthy, Ojas Gandhi and Michael A. Ramirez | |

It is certified that error appears in the above-identified patent and that said Letters Patent is hereby corrected as shown below:

In the Claims

Claim 18, Column 19, Line 11:
Replace "further comprising" with --wherein--

Claim 18, Column 19, Line 13:
Insert --are-- after "write buffers"

Signed and Sealed this
Fifth Day of November, 2024

Katherine Kelly Vidal
*Director of the United States Patent and Trademark Office*